(12) United States Patent
Furukawa et al.

(10) Patent No.: US 11,196,102 B2
(45) Date of Patent: Dec. 7, 2021

(54) MANAGEMENT DEVICE AND POWER SUPPLY SYSTEM

(71) Applicant: SANYO Electric Co., Ltd., Daito (JP)

(72) Inventors: Kimihiko Furukawa, Hyogo (JP); Jun Asakura, Hyogo (JP)

(73) Assignee: SANYO Electric Co., Ltd., Daito (JP)

( * ) Notice: Subject to any disclaimer, the term of this patent is extended or adjusted under 35 U.S.C. 154(b) by 567 days.

(21) Appl. No.: 16/095,888

(22) PCT Filed: Apr. 19, 2017

(86) PCT No.: PCT/JP2017/015644
§ 371 (c)(1),
(2) Date: Oct. 23, 2018

(87) PCT Pub. No.: WO2017/188073
PCT Pub. Date: Nov. 2, 2017

(65) Prior Publication Data
US 2021/0223322 A1     Jul. 22, 2021

(30) Foreign Application Priority Data

Apr. 27, 2016  (JP) .............................. JP2016-089827

(51) Int. Cl.
*G01R 31/3835* (2019.01)
*G01R 31/58* (2020.01)
*H01M 10/48* (2006.01)

(52) U.S. Cl.
CPC ........ *H01M 10/48* (2013.01); *G01R 31/3835* (2019.01); *G01R 31/58* (2020.01)

(58) Field of Classification Search
CPC ............................ G01R 31/3835; G01R 31/58
See application file for complete search history.

(56) References Cited

U.S. PATENT DOCUMENTS 8,294,426 B2 * 10/2012 Kosugi .................... B60L 3/12
                                                                                    320/117
9,340,122 B2 *  5/2016 Yamauchi .......... G01R 31/3835
(Continued)

FOREIGN PATENT DOCUMENTS

JP      2008-96140 A     4/2008
JP      2013-50312 A     3/2013
(Continued)

OTHER PUBLICATIONS

International Search Report dated May 30, 2017, issued in counterpart International Application No. PCT/JP2017/015644 (2 pages).

*Primary Examiner* — Walter L Lindsay, Jr.
*Assistant Examiner* — Milton Gonzalez
(74) *Attorney, Agent, or Firm* — Westerman, Hattori, Daniels & Adrian, LLP

(57) ABSTRACT

In order to easily detect a disconnection in a lowest-order voltage detection line when a voltage detection circuit for detecting the respective voltage of a plurality of serially connected cells is made redundant, the operation power supply of a first voltage detection circuit and a second voltage detection circuit is fed from both ends of a plurality of serially connected cells. The lowest node of the plurality of cells and the first voltage detection circuit are connected by the two lines of a voltage detection line and a negative power supply line. The lowest node of the plurality of cells and the second voltage detection circuit are connected by a single wire serving as both of a voltage detection line and a negative power supply line.

7 Claims, 6 Drawing Sheets

(56) References Cited

U.S. PATENT DOCUMENTS

| | | | |
|---|---|---|---|
| 2013/0214791 A1 | 8/2013 | Okaniwa et al. | |
| 2015/0077124 A1* | 3/2015 | Suzuki | H02J 7/0021 |
| | | | 324/426 |
| 2015/0137821 A1 | 5/2015 | Sawayanagi et al. | |
| 2018/0196105 A1* | 7/2018 | Inukai | G01R 31/3835 |
| 2019/0056453 A1* | 2/2019 | Matsubara | H01M 10/482 |

FOREIGN PATENT DOCUMENTS

| | | |
|---|---|---|
| JP | 2013-172544 A | 9/2013 |
| JP | 2015-97461 A | 5/2015 |
| JP | 2015-219094 A | 12/2015 |

* cited by examiner

MANAGEMENT DEVICE AND POWER SUPPLY SYSTEM

TECHNICAL FIELD

The present invention relates to a management device and a power supply system that manage a state of power storage modules.

BACKGROUND ART

In recent years, hybrid vehicles (HV), plug-in hybrid vehicles (PHV), and electric vehicles (EV) are being spread. Secondary batteries as a key device are installed in these vehicles. As secondary batteries for the vehicle, the nickel hydride batteries and the lithium ion batteries are spread. In the future, it is expected that spread of the lithium ion batteries having high energy density are accelerated.

Since the operable voltage range and the prohibited voltage range in the lithium ion batteries are close, the stricter voltage management is necessary in the lithium ion batteries than other types of batteries. When an assembled battery in which a plurality of the lithium ion battery cells are connected in series is used, a voltage detection circuit is provided for detecting each of the battery cells. Each node of the plurality of cells and the voltage detection circuit are connected by a plurality of voltage detection lines (for example, refer to Patent Literatures 1 and 2). The detected voltages are used for a state-of-charge (SOC) management, an equalization control, and the like.

Generally, the operation power supply of the voltage detection circuit is fed from both ends of the assembled battery as the measuring object, in order to simplify its power source circuit. In this configuration, the following design ways are thought. In a first design way, voltage detection lines of the highest and lowest cells among the cells constituting the assembled battery are also used as the positive and negative power supply lines. In a second design way, voltage detection lines of the highest and lowest cells among the cells constituting the assembled battery are separately wired from the positive and negative power supply lines. In the first design way, the number of wiring can be reduced, and the circuit can be simplified. On the other hand, in the second design way, since operating currents of the voltage detection circuit do not flow through the highest and lowest voltage detection lines, the decrease of the detection accuracy in the highest and lowest node voltages can be prevented. Additionally, even in a case where the highest/lowest voltage detection line is disconnected, the operation power supply of the voltage detection circuit can be continued.

When a terminal voltage of the voltage detection circuit connected to this disconnected voltage detection line is decreased due to the disconnection of the voltage detection line, it cannot be immediately determined if the voltage detection line of the voltage detection circuit is disconnected, or if the cell voltage decreases. Accordingly, there is the following way. By making the equalizing circuit disposed between this voltage detection line and the voltage detection line adjacent this conductive, it is determined whether or not the disconnection happens through observing the voltage change of this voltage detection line. In this way, since it is premised that the equalizing circuit is normal, it is necessary to detect the failure of the equalizing circuit itself.

CITATION LIST

Patent Literature

Patent Literature 1: Unexamined Japanese Patent Publication No. 2013-50312
Patent Literature 2: Unexamined Japanese Patent Publication No. 2013-172544

SUMMARY OF THE INVENTION

Technical Problem

Generally, the configuration is used that the voltage detection circuit is made redundant, in order to prepare for the failure of the equalizing circuit itself. By comparing the detected values of the plurality of voltage detection circuits, the failure of the voltage detection circuit or the disconnection of the voltage detection line can be detected.

The present disclosure is developed for the purpose of solving such requirements. One non-limiting and explanatory embodiment provides a technology which easily detects a disconnection in a lowest-order voltage detection line when a voltage detection circuit for detecting the respective voltage of a plurality of serially connected cells is made redundant, To solve the above-mentioned problem, a management device of one aspect of the present invention, includes:
a first voltage detection circuit which is connected by voltage detection lines to each node in a plurality of cells connected in series and detects the voltage of each of the plurality of cells; and
a second voltage detection circuit which is connected by voltage detection lines to each node in the plurality of cells and detects the voltage of each of the plurality of cells. The operation power supply of the first voltage detection circuit and the second voltage detection circuit is fed from both ends of the plurality of cells.

The lowest node of the plurality of cells and the first voltage detection circuit are connected by two lines of the voltage detection line and a negative power supply line, and
the lowest node of the plurality of cells and the second voltage detection circuit are connected by a single wire of the negative power supply line also serving as a voltage detection line.

Any desired combinations of the above-described components and converted expressions of the present invention in methods, devices, systems, and other similar entities are still effective as aspects of the present invention.

According to the one aspect of the present invention, a disconnection in a lowest-order voltage detection line can be easily detected when a voltage detection circuit for, detecting the respective voltage of a plurality of serially connected cells is made redundant.

DESCRIPTION OF EMBODIMENTS

Figure 1:
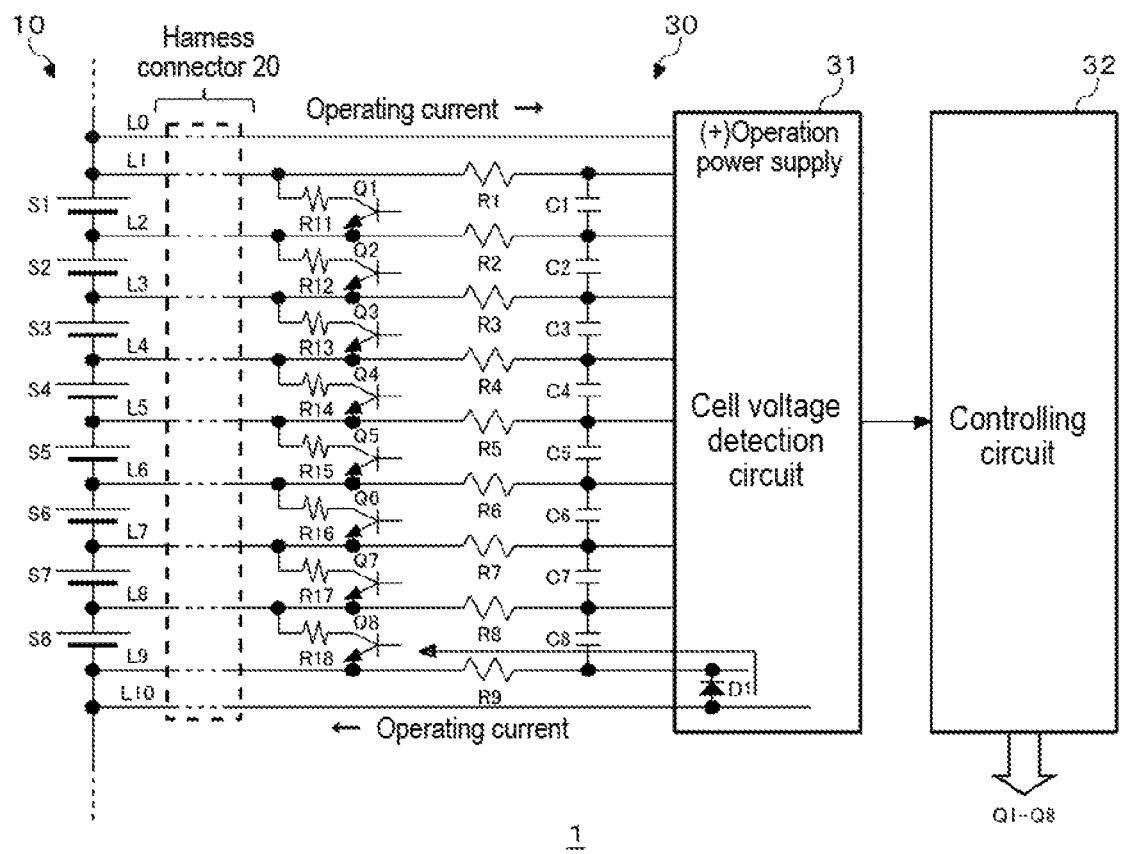
FIG. 1 is a diagram for describing a power supply system according to a comparative example 1.

FIG. 1 is a diagram for describing a power supply system according to a comparative example 1. Power supply system 1 includes power storage module 10 and management device 30. Power storage module 10 includes a plurality of cells connected in series. A lithium ion battery cell, a nickel hydride battery cell, a lead battery, an electric double layer capacitor cell, a lithium ion capacitor cell, or the like can be used for the cells. Hereinafter, in the description, an example is supposed that uses a lithium ion battery cell (nominal voltage: 3.6 V to 3.7 V). FIG. 1 shows an example using the assembled battery in which 8 pieces of the lithium ion battery cells (first cell S1-eighth cell S8) are connected in series.

Management device 30 includes an equalizing circuit, an input filter, cell voltage detection circuit 31, and controlling circuit 32. Then, those are installed on a printed wiring board. Cell voltage detection circuit 31 is connected, by voltage detection lines L1-L9, to each node in a plurality of cells S1-S8 connected in series, and detects a voltage of each of cells S1-S8 by detecting voltages between adjacent voltage detection lines. Cell voltage detection circuit 31, for example, is configured of an ASIC (Application Specific Integrated Circuit) as the specific custom IC, or the like. Cell voltage detection circuit 31 transmits the detected voltage of each of cells S1-S8 to controlling circuit 32.

Each of wire harnesses is connected to each of the nodes of the plurality of cells S1-S8 of power storage module 10. Then, a tip connector of each of the wire harnesses is connected to each of connectors of management device 30 which is installed on the printed wiring board. Namely, power storage module 10 and management device 30 are electrically connected by harness connector 20.

Resistors R1-R9 are respectively inserted in voltage detection lines L1-L9, and capacitors C1-C8 are respectively connected between the adjacent two lines of the voltage detection lines. Resistors R1-R9 and capacitors C1-C8 constitute the input filter (low pass filter), and has a function in which the voltages inputted in cell voltage detection circuit 31 are stabilized.

Each connector of management device 30 and each of detection terminals of cell voltage detection circuit 31 are connected by voltage detection lines L1-L9. The equalizing circuits are respectively connected between the adjacent two lines of the voltage detection lines. In the example shown in FIG. 1, the equalizing circuit is configured of a series circuit of discharge resistors R11-R18 and discharge switches Q1-Q8. Discharge switches Q1-Q8, for example, are configured of transistors.

Controlling circuit 32 carries out equalizing controls based on the voltages received from cell voltage detection circuit 31. Concretely, controlling circuit 32 adjusts the voltages of the other cells except the cell of the lowest voltage, to the voltage of the cell of the lowest voltage among the plurality of cells S1-S8. Controlling circuit 32 turns on the discharge switches of the equalizing circuits which are connected in parallel to the other cells, and makes the other cells discharge. When the voltages of the other cells decrease to the voltage of the cell of the lowest voltage, controlling circuit 32 turns off the discharge switches of the equalizing circuits which are connected in parallel to the other cells. Controlling circuit 32, for example, is configured of a microprocessor.

The operation power supply of cell voltage detection circuit 31 is fed from power storage module 10 as the monitoring object, in order to simplify its power source circuit. In a case where the operation power supply of cell voltage detection circuit 31 is fed from a power source other than power storage module 10, a size of a circuit is increased due to an insulation treatment, to increase cost.

Generally, the circuit operating current of cell voltage detecting circuit 31 is approximately several mA to several tens mA. In a case where the power supply line also serves as a voltage detection line, a voltage drop caused by this circuit operating current, affects the detected voltage. Especially, in power supply system 1 in which lithium ion batteries are used that needs a high accurate management, this voltage drop cannot be ignored. Therefore, it is thought that the voltage detection line is separately wired from the power supply line.

In the example shown in FIG. 1, the highest node of the plurality of cells S1 to S8 constituting power storage module 10 and cell voltage detection circuit 31 are connected by two wires of first voltage detection line L1 and positive power supply line L0. Similarly, the lowest node of the plurality of cells S1 to S8 and cell voltage detection circuit 31 are connected by two wires of ninth voltage detection line L9 and negative power supply line L10.

Within cell voltage detection circuit 31, ESD (Electro-Static Discharge) protection diode D1 is connected between a ninth detection terminal connected to ninth voltage detection line L9 and a negative power supply terminal connected to negative power supply line L10. An ESD (Electro-Static Discharge) protection diode (not shown in the figures) is connected between a positive power supply terminal connected to positive power supply line L0 and a first detection terminal connected to first voltage detection line L1. Generally, these ESD protection diodes are installed in advance at a time of manufacturing an IC.

Hereinafter, both of a connection failure and a disconnection are comprehensively called as "disconnection". Namely, "disconnection" includes not only physically cutting wiring, but also electrically cutting. When the disconnection occurs at harness connector 20, it is impossible to properly detect a cell voltage by cell voltage detection circuit 31. In this case, a monitor of cell state or an equalization control by controlling circuit 32 cannot be properly carried out.

Therefore, generally a function is provided that the disconnection state is detected as the abnormal voltage by operating the equalizing circuit. For example, after making the equalizing circuit conductive, if the cell voltage largely decreases, it is determined that the voltage detection line is disconnected, and if the cell voltage hardly charge, it is determined that the SOC of the cell decreases. However, in this method, it is necessary to install an additional function for carrying out it. Further, a failure detection circuit for detecting the failure of the equalizing circuit itself is necessary separately. It is impossible to detect the failure of the equalizing circuit by only monitoring the cell voltages through cell voltage detection circuit 31.

When positive power supply line L0 and/or negative power supply line L10 is disconnected, the following two of results happen. Then, power supply system 1 is safely stopped by the failure detection.

(1) Since the power supply to cell voltage detection circuit 31 is not supplied, there is no response from cell voltage detection circuit 31. Then, controlling circuit 32 detects this failure.

(2) The operating current of cell voltage detection circuit 31 continuously flows through ESD protection diode D1, the voltage detection line adjacent to the disconnected power supply line. Here, the voltage of this voltage detection line is affected by the voltage drop generated by that the operating current flows through the filter resistor. Thus, since the cell voltage is detected as a value which is largely lower than a normal use range, controlling circuit 32 detects it as an over-discharge. For example, when negative power supply line L10 is disconnected in FIG. 1, the operating current flows through ninth voltage detection line L9 via ESD protection diode D1. Then, the voltage of eighth cell S8 is detected as a low value. In a configuration where the ESD protection diode (not shown in the figures) is connected between the positive power supply terminal connected to positive power supply line L0 and the first detection terminal connected to first voltage detection line L1, when positive power supply line L0 is disconnected, the operating current flows through first voltage detection line L1 via this ESD protection diode.

Figure 2:
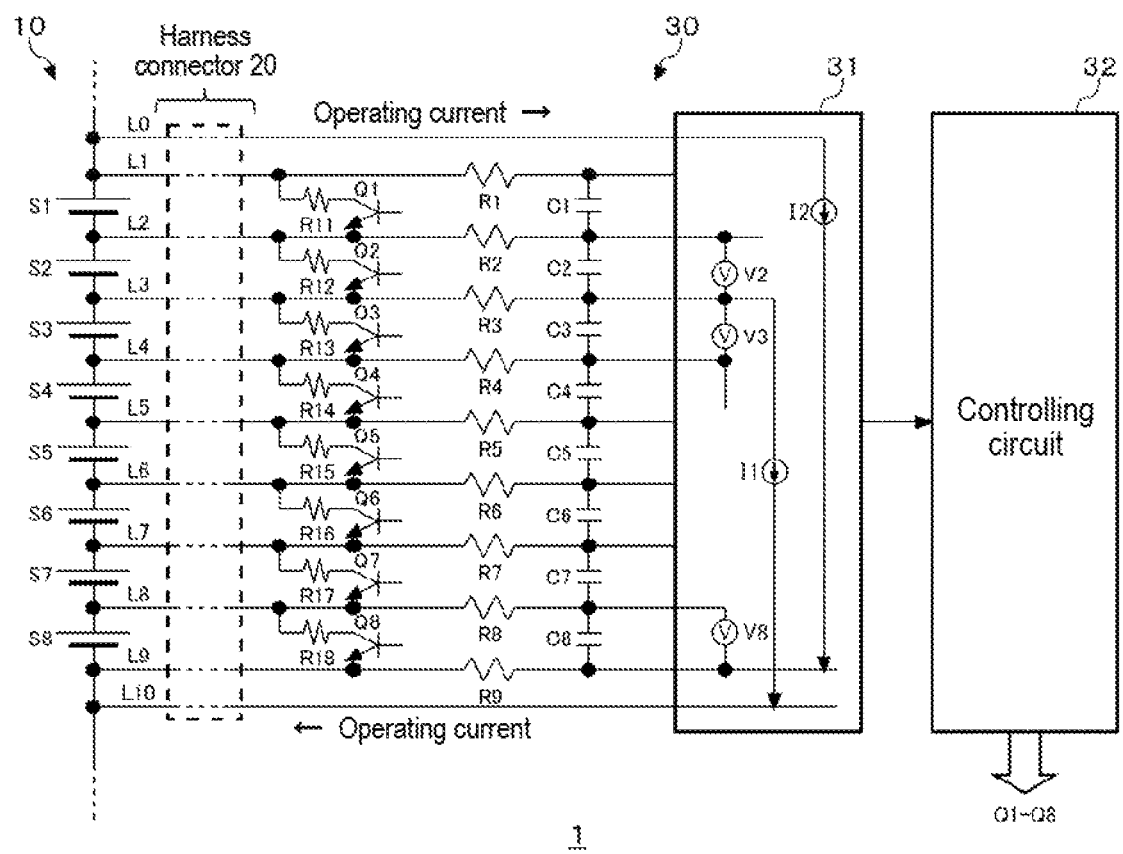
FIG. 2 is a diagram for describing a power supply system according to a comparative example 2.

FIG. 2 is a diagram for describing power supply system 1 according to a comparative example 2. Inside cell voltage detection circuit 31, a multiplexer and an AD converter for detecting the voltages are usually used. In this case, usually, a little leakage current occurs in a direction from a potential of each detection terminal of cell voltage detection circuit 31 to the ground electric potential (refer to current 11 in FIG. 2). The leakage current is usually smaller enough than 1 µA, and a circuit is designed such that a noticeable detection error does not happen even in a case where a filter resistor having approximately several kΩ is used.

Second capacitor C2 and third capacitor C3 constitute the input filter of the third detection terminal. Due to this leakage current, second capacitor C2 is charged, and third capacitor C3 is discharged. Thereby, the potential of the third detection terminal gradually decreases, and voltage V2 between the second detection terminal and the third detection terminal is detected at a value larger than a value of the actual voltage of second cell S2. Conversely, voltage V3 between the third detection terminal and the fourth detection terminal is detected at a value smaller than a value of the actual voltage of third cell S3. As a result, it is determined that second cell S2 is an over-charge and third cell S3 is an over-discharge, and power supply system 1 is stopped by the abnormal detection.

Here, since a leakage current occurs to the ground electric potential, no leakage current flows from the potential of the ninth detection terminal which has the same potential as the ground electric potential within cell voltage detection circuit 31. Accordingly, since the voltage does not change even when ninth voltage detection line L9 is disconnected, the disconnection of ninth voltage detection line L9 is not detected.

In order to prevent this, the following is thought. Current source I2 is added, and when ninth voltage detection line L9 is disconnected, voltage V8 between the eighth detection terminal and the ninth detection terminal is intentionally changed to the abnormal voltage. However, the additional circuit element is necessary. Further, a failure detection circuit for detecting the failure of current source I2 itself is also necessary. In a case where the failure detection circuit of current source I2 is not provided, since the voltage between the eighth detection terminal and the ninth detection terminal does not change even when ninth voltage detection line L9 is disconnected at the failure of current source I2, neither the failure of current source I2 nor the disconnection of ninth voltage detection line L9 is detected.

In FIG. 2, current source I2 for detecting the disconnection of ninth voltage detection line L9 is depicted, and current sources for detecting disconnections of other voltage detection lines are also installed. However, in the method in which the disconnection is detected by using the leakage current to the ground electric potential, an increase of a consumption current and an increase of a detection error occur. Further, this method has the following characteristics. As the voltage detection line is higher, the disconnection can be easily detected, and as the voltage detection line is lower, it becomes difficult to detect the disconnection. As mentioned above, it is impossible to detect the disconnection of the lowest voltage detection line without adding the current source.

Figure 3:
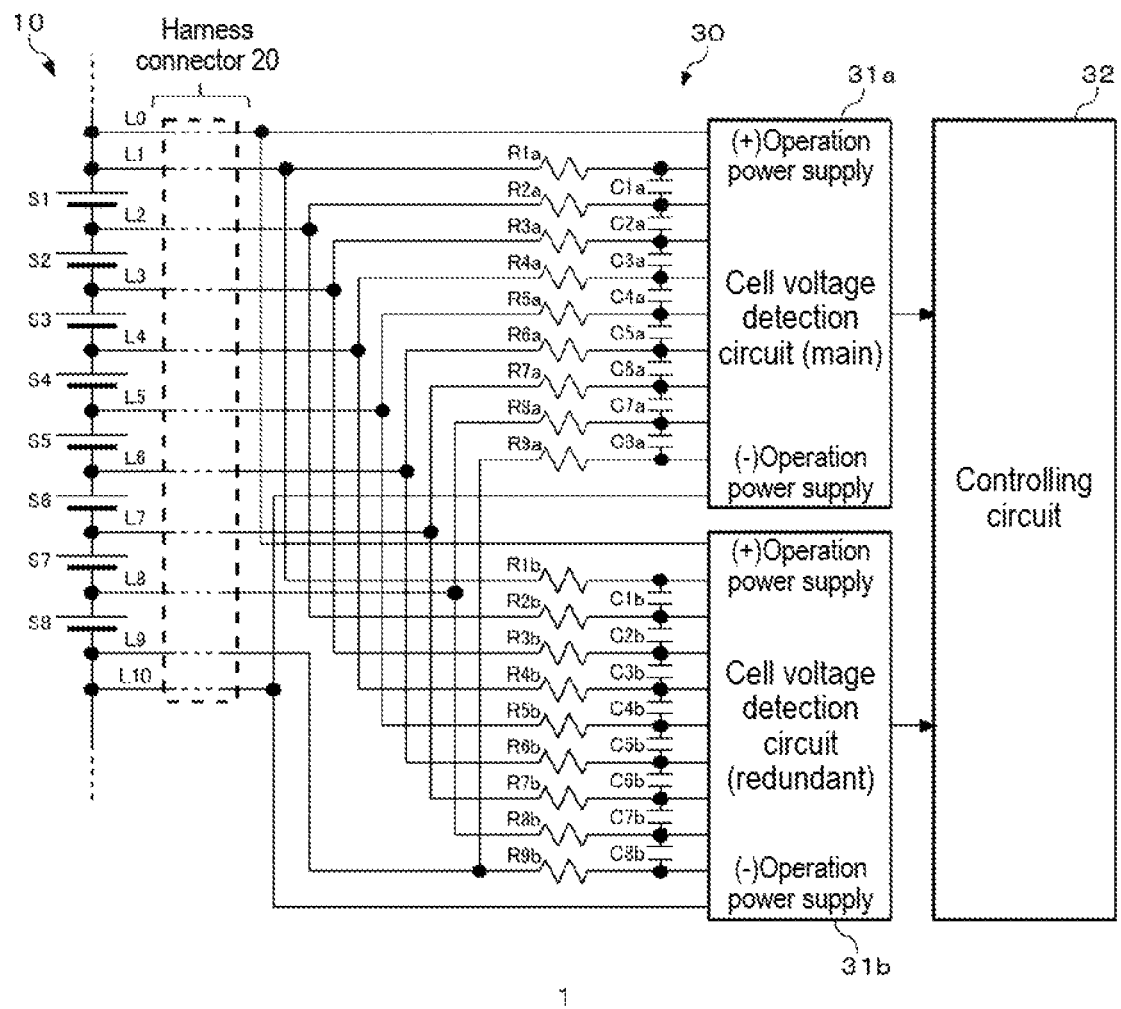
FIG. 3 is a diagram for describing a power supply system according to a comparative example 3.

FIG. 3 is a diagram for describing power supply system 1 according to a comparative example 3. In the comparative example 3, cell voltage detection circuit 31 is made redundant. In order to simplify the figure, equalizing circuits are omitted in FIG. 3.

First cell voltage detection circuit 31a is a main detecting circuit, and second cell voltage detection circuit 31b is a redundant detecting circuit. The main detecting circuit is designed to a high specification for controlling power supply system 1 with high accuracy. The redundant detecting circuit is fundamentally provided for confirming if the main detecting circuit normally operates, and is designed to a low specification compared with the main detecting circuit. For example, the resolution of the AD converter installed in the redundant detecting circuit is lower than that of the AD converter installed in the main detecting circuit.

Further, the detecting period of the redundant detecting circuit may be longer than that of the main detecting circuit. When the detecting period is long, the responsiveness to the abrupt changes is decreased, but there is a feature that the consumption power is suppressed.

The main purpose of the redundant detecting circuit is not a SOC management of cells or an equalization control, but is to detect the failure of the main detecting circuit or to detect the over-charge/over-discharge of the cells.

Accordingly, the lower specification than that of the main detecting circuit can be permitted, and thereby the circuit cost and consumption current can be decreased.

First cell voltage detection circuit 31a transmits the detected voltage of each of cells S1-S8 to controlling circuit 32, and second cell voltage detection circuit 31b also transmits the detected voltage of each of cells S1-S8 to controlling circuit 32. Controlling circuit 32 compares the detected voltage of each of cells S1-S8 received from first cell voltage detection circuit 31a with the detected voltage of each of cells S1-S8 received from second cell voltage detection circuit 31b. According to this, the failure of first cell voltage detection circuit 31a or second cell voltage detection circuit 31b can be detected.

Even though cell voltage detection circuit 31 is made redundant, harness connector 20 is installed as a single. The installed space and cost of harness connector 20 is large and different from electric components. Positive power supply line L0, the plurality of voltage detection lines L1-L9, and negative power supply line L10 are respectively divided into two lines in a subsequent stage from harness connector 20 on the printed wiring board as shown in FIG. 3. When the circuit is made redundant at the stage of wire harness, it is necessary to make the number of wire harnesses two times. Therefore, as the number of series connections in the cells becomes large, the number of wire harnesses become increased.

The voltage change caused by the leakage current or the like at a time of disconnection is the same as mentioned above, also in the circuit configuration shown in FIG. 3. Then, the disconnection of ninth voltage detection line L9 hardly affects the detected value of the ninth detection terminal. Since both of the main detecting circuit and the redundant detecting circuit show the same voltage change, the disconnection cannot be detected even in the circuit made redundant.

Figure 4A:
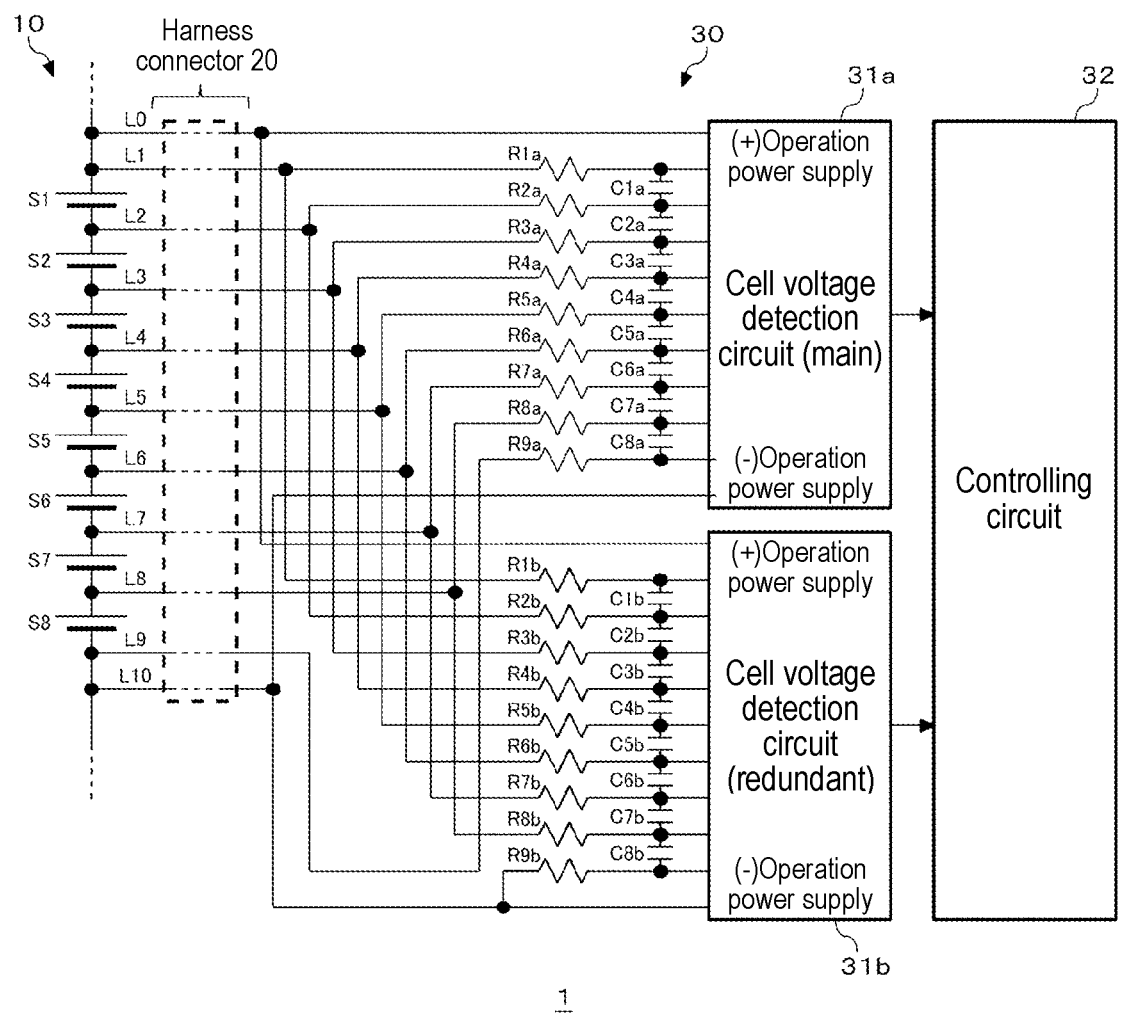
FIGS. 4A-4C are diagrams for describing a power supply system according to exemplary embodiments of the present invention.

FIG. 4A is a diagram for describing power supply system 1 according to an exemplary embodiment of the present invention. In the exemplary embodiment, the lowest node of the plurality of cells S1 to S8 and first cell voltage detection circuit 31a are connected by two wires of ninth voltage detection line L9 and negative power supply line L10. On the other hand, the lowest node of the plurality of cells S1 to S8 and second cell voltage detection circuit 31b are connected by one wire of negative power supply line L10 also serving as a voltage detection line. The ninth detection terminal of second cell voltage detection circuit 31b is connected to the ground through ninth resistor 9b.

In this configuration, at the time of the disconnection of ninth detection line L9, the ninth detection terminal of the main detecting circuit (first cell voltage detection circuit 31a) is set at a floating potential (indefinite state). However, at the ninth detection terminal of the redundant detecting circuit (second cell voltage detection circuit 31b), the voltage of the lowest node of the plurality of cells S1 to S8 can be continuously detected. Accordingly, even in a case where the over-charge/over-discharge of eighth cell S8 occurs, the over-charge/over-discharge of eighth cell S8 can be detected by the redundant detecting circuit, and thereby controlling circuit 32 protects it.

The main detecting circuit detects the voltage of eighth cell S8 by using ninth voltage detection line L9 through which operating currents of the main detecting circuit and redundant detecting circuit do not flow. Accordingly, as long as ninth voltage detection line L9 is not disconnected, the voltage of eighth cell S8 is detected with high accuracy by the main detecting circuit, and thereby power supply system 1 is controlled with high accuracy. The redundant detecting circuit detects the voltage of eighth cell S8 by using negative power supply line l10. Since it is enough that the redundant detecting circuit can detect the over-charge/over-discharge, a small detection error caused by using negative power supply line L10, is allowed.

At the time of the disconnection of negative power supply line L10, the operation power supply is kept through ESD protection diode D1 and ninth voltage detection line L9. At the time of the disconnection of negative power supply line l10, the voltage between the eighth detection terminal and the ninth detection terminal largely changes (decreases). Thereby, controlling circuit 32 can detect the disconnection of negative power supply line L10 or the over-discharge of eighth cell S8.

The highest node of the plurality of cells S1 to S8 and first cell voltage detection circuit 31a are connected by two wires of first voltage detection line L1 and positive power supply line L0. Similarly, the highest node of the plurality of cells S1 to S8 and second cell voltage detection circuit 31b are also connected by two wires of first voltage detection line L1 and positive power supply line L0.

Since the influence of the leakage current is large when first voltage detection line L1 is disconnected, the disconnection of first voltage detection line L1 is easily detected. It is different from the disconnection of ninth voltage detection line L9. Therefore, the need is low that one wire of the positive power supply line also serving as a voltage detection line connects between the highest node of the plurality of cells S1 to S8 and either of first cell voltage detection circuit 31a or second cell voltage detection circuit 31b. The following configuration may be used. In order to secure the operation power supply of either of first cell voltage detection circuit 31a or second cell voltage detection circuit 31b at the time of the disconnection of positive power supply line L0, one wire of the positive power supply line also serving as a voltage detection line may connect between the highest node and either (for example, second cell voltage detection circuit 31b) of first cell voltage detection circuit 31a or second cell voltage detection circuit 31b.

As explained above, according to the exemplary embodiment, by making cell voltage detection circuit 31 redundant, the plurality of the cell S1 to S8 can be monitored by both of the main detecting circuit and the redundant detecting circuit, and thereby safe power supply system 1 can be established. By changing connection states (ways) of the lowest node of the plurality of cells S1 to S8 in the main detecting circuit and the redundant detecting circuit, the disconnection of ninth voltage detection line L9 can be simply detected without an additional special circuit for detecting the disconnection. Since the operation power supply of the main detecting circuit can be secured by providing ESD protection diode D1 even at the time of the disconnection of negative power supply line L10, fail-safe operation can be carried out. Accordingly, while securing safety of power supply system 1, high reliability can be obtained.

In the above explanation, the lowest node of the plurality of cells S1 to S8 and second cell voltage detection circuit 31b are connected by one wire of negative power supply line L10 also serving as a voltage detection line. However, the configuration may be used that positive power supply line L0 also serves as a voltage detection line. In this configuration, it is preferable that an ESD protection diode is connected between the positive power supply terminal connected to positive power supply line L0 and the first detection terminal connected to first voltage detection line L1. According to this configuration, when positive power supply line L0 is disconnected, the operating current flows through first voltage detection line L1 via this ESD protection diode, and the operation power supply of the circuit can be secured, and it is possible to detect the disconnection.

The present invention has been described based on the exemplary embodiment. A person of the ordinary skill in the art can understand that the exemplary embodiment is illustrative only, constitution elements and combined processes can be modified, and such modified examples are covered by the scope of the present invention.

In the above-mentioned exemplary embodiment, the specification of the redundant detecting circuit is lower than that of the main detecting circuit, and the balance of the detection accuracy and the cost is kept. However, the specifications of the main detecting circuit and the redundant detecting circuit may be the same. In a case where both circuits are designed to the high specification, a SOC management of cells or an equalization control can be carried out with high accuracy, based on the detected values of the redundant detecting circuit.

In the above-mentioned exemplary embodiment, the example is assumed that power supply system 1 is used for a power source device for vehicles. However, the power storage system is not limited to use for vehicles, and then can be used as the power source device for airplanes, for ships, for stationary types, or for other uses. For example, the function of ESD protection diode D1 can be accomplished by installing a usual diode at a location where the same effect is obtained. Further, in the above exemplary embodiment, it is mentioned that the disconnection of first voltage detection line L1 is easily detected. In a case that it is not easily detected depending on the circuit configuration, only first resistor R1b may be connected to the positive power supply line in the same way as the connecting method of ninth resistor R9b.

The exemplary embodiment may be specified by items described below.

[Item 1]

A management device (30) includes:

a first voltage detection circuit (31a) which is connected by voltage detection lines (L1-L9) to each node in a plurality of cells (S1-S8) connected in series and detects the voltage of each of the plurality of cells; (S1-S8) and a second voltage detection circuit (31b) which is connected by voltage detection lines (L1-L9) to each node in the plurality of cells (S1-S8) and detects the voltage of each of the plurality of cells (S1-S8).

The operation power supply of the first voltage detection circuit (31a) and the second voltage detection circuit (31b) is fed from both ends of the plurality of cells (S1-S8).

The lowest node of the plurality of cells (S1-S8) and the first voltage detection circuit (31a) are connected by two lines of the voltage detection line (L9) and a negative power supply line (L10).

The lowest node of the plurality of cells (S1-S8) and the second voltage detection circuit (31b) are connected by a single wire of the negative power supply line (L10) also serving as a voltage detection line.

According to this, the disconnection of the voltage detection line (L9) connected to the lowest node of the plurality of cells (S1-S8) can be easily detected.

[Item 2]

Figure 4B:
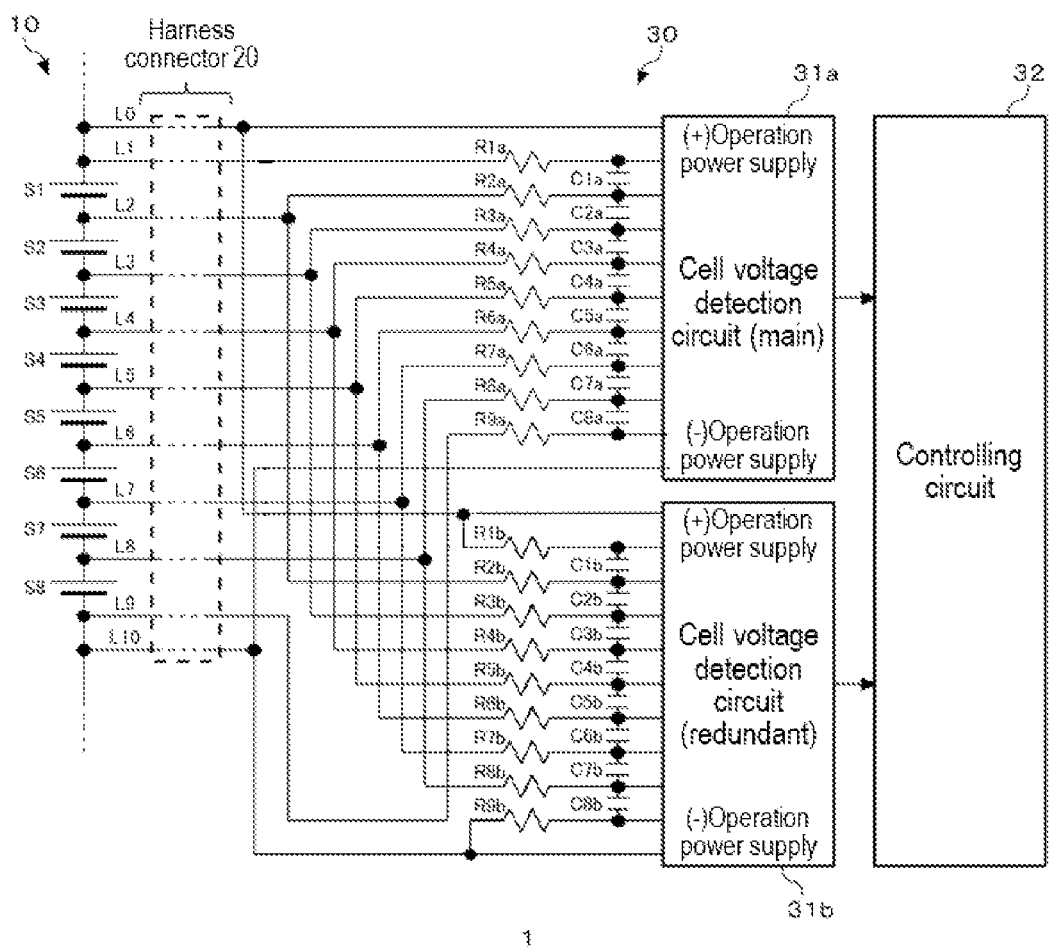

In the management device (30) according to item 1, the highest node of the plurality of cells (S1-S8) and the first voltage detection circuit (31a) are connected by two lines of the voltage detection line (L1) and a positive power supply line (L0), and as depicted in FIG. 4B, the highest node of the plurality of cells (S1-S8) and the second voltage detection circuit (31b) are connected by a single wire of the positive power supply line (L0) also serving as a voltage detection line (L1).

According to this, the disconnection of the voltage detection line (L1) connected to the highest node of the plurality of cells (S1-S8) can be easily detected.

[Item 3]

In the management device (30) according to item 1, the highest node of the plurality of cells (S1-S8) and the first voltage detection circuit (31a) are connected by two lines of the voltage detection line (L1) and a positive power supply line (L0), and the highest node of the plurality of cells (S1-S8) and the second voltage detection circuit (31b) are connected by two lines of the voltage detection line (L1) and a positive power supply line (L0).

According to this, the decrease of the detection accuracy of the highest cell (S1) in the first voltage detection circuit (31a) and the second voltage detection circuit (31b) can be prevented.

[Item 4]

In the management device (30) according to any one of items 1 to 3, each of wire harnesses is connected to each of the nodes of the plurality of cells (S1-S8), and a tip connector of each of the wire harnesses is connected to each of connectors of the management device (30), and wiring which is connected to each of the nodes of the plurality of cells (S1-S8), is branched within the management device (30).

According to this, an increase of the connectors of the wire harnesses due to making redundant, can be prevented.

[Item 5]

Figure 4C:
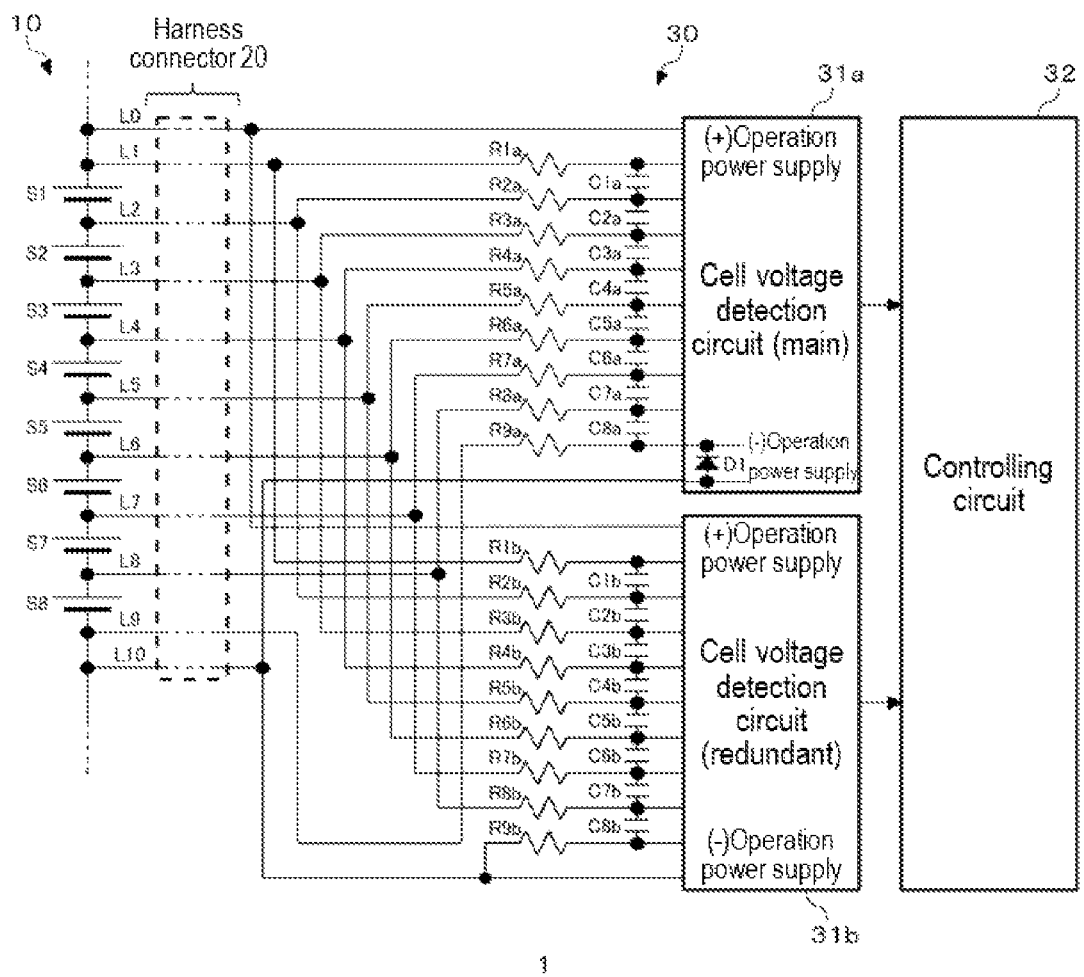

In the management device (30) according to any one of items 1 to 4, as depicted in FIG. 4C, in the first voltage detection circuit (31a), a diode (D1) is connected between a terminal connected to the voltage detection line (L9) connected to the lowest node of the plurality of cells (S1-S8) and a terminal connected to the negative power supply line (L10).

According to this, the operation power supply of the first voltage detection circuit (31a) can be secured even at the time of the disconnection of negative power supply line (L10).

[Item 6]

In the management device (30) according to any one of items 1 to 5, the first voltage detection circuit (31a) is a main detecting circuit, and the second voltage detection circuit (31b) is a redundant detecting circuit which has a specification lower than a specification of the first voltage detection circuit (31a).

According to this, the balance of the detection accuracy and the cost can be kept.

[Item 7]

A power supply system (1) includes:

a power storage module (10) in which a plurality of cells (S1-S8) are connected in series; and the management device (30) according to any one of claims 1 to 6, which manages the power storage module (10).

According to this, the disconnection of the voltage detection line (L9) connected to the lowest node of the plurality of cells (S1-S8) can be easily detected.

The invention claimed is:

1. A management device comprising:
a first voltage detection circuit which is connected by voltage detection lines to each node in a plurality of cells connected in series and detects the voltage of each of the plurality of cells; and
a second voltage detection circuit which is connected by voltage detection lines to each node in the plurality of cells and detects the voltage of each of the plurality of cells,
wherein an operation power supply of the first voltage detection circuit and the second voltage detection circuit is fed from both ends of the plurality of cells,
a lowest node of the plurality of cells and the first voltage detection circuit are connected by one of the voltage detection lines and a negative power supply line, and
the lowest node of the plurality of cells and the second voltage detection circuit are connected by a single wire of the negative power supply line also serving as a voltage detection line.

2. The management device according to claim 1,
wherein a highest node of the plurality of cells and the first voltage detection circuit are connected by one of the voltage detection lines and a positive power supply line, and
the highest node of the plurality of cells and the second voltage detection circuit are connected by a single wire of the positive power supply line also serving as a voltage detection line.

3. The management device according to claim 1,
wherein a highest node of the plurality of cells and the first voltage detection circuit are connected by one of the voltage detection lines and a positive power supply line, and
the highest node of the plurality of cells and the second voltage detection circuit are connected by one of the voltage detection lines and a positive power supply line.

4. The management device according to claim 1,
wherein each of wire harnesses is connected to each of the nodes of the plurality of cells, and a tip connector of each of the wire harnesses is connected to each of connectors of the management device, and
wiring which is connected to each of the nodes of the plurality of cells, is branched within the management device.

5. The management device according to claim 1,
wherein in the first voltage detection circuit, a diode is connected between a terminal connected to the voltage detection line connected to the lowest node of the plurality of cells and a terminal connected to the negative power supply line.

6. The management device according to claim 1,
wherein the first voltage detection circuit is a main detecting circuit, and
the second voltage detection circuit is a redundant detecting circuit which has a specification lower than a specification of the first voltage detection circuit.

7. A power supply system comprising:
a power storage module in which a plurality of cells are connected in series; and
the management device according to claim 1, which manages the power storage module.

* * * * *